US009493345B2

(12) United States Patent
Cho et al.

(10) Patent No.: US 9,493,345 B2
(45) Date of Patent: Nov. 15, 2016

(54) METHOD FOR MANUFACTURING SLANTED COPPER NANORODS

(71) Applicant: AJOU UNIVERSITY INDUSTRY-ACADEMIC COOPERATION FOUNDATION, Suwon-si, Gyeonggi-do (KR)

(72) Inventors: Sung-Woon Cho, Suwon-si (KR); Chang-Koo Kim, Seoul (KR)

(73) Assignee: Ajou University Industry-Academic Cooperation Foundation, Gyeonggi-do (KR)

( * ) Notice: Subject to any disclaimer, the term of this patent is extended or adjusted under 35 U.S.C. 154(b) by 0 days.

(21) Appl. No.: 14/761,467

(22) PCT Filed: Apr. 19, 2013

(86) PCT No.: PCT/KR2013/003326
§ 371 (c)(1),
(2) Date: Jul. 16, 2015

(87) PCT Pub. No.: WO2014/112694
PCT Pub. Date: Jul. 24, 2014

(65) Prior Publication Data
US 2015/0368093 A1    Dec. 24, 2015

(30) Foreign Application Priority Data

Jan. 16, 2013    (KR) .......................... 10-2013-0005075

(51) Int. Cl.
*C25F 3/00*    (2006.01)
*B81C 1/00*    (2006.01)
(Continued)

(52) U.S. Cl.
CPC .......... *B81C 1/00031* (2013.01); *H01L 21/288* (2013.01); *H01L 21/3212* (2013.01); *H01L 21/32137* (2013.01)

(58) Field of Classification Search
USPC ........................................................ 216/11
See application file for complete search history.

(56) References Cited

U.S. PATENT DOCUMENTS

| 8,299,341 B2 | 10/2012 | Greer et al. .................. 977/712 |
| 2006/0216836 A1 | 9/2006 | Pullini et al. ..................... 438/3 |

(Continued)

FOREIGN PATENT DOCUMENTS

| JP | 2008-4711 A | 1/2008 |
| KR | 10-0281241 B1 | 11/2000 |

(Continued)

OTHER PUBLICATIONS

International Search Report dated Jun. 26, 2013, issued to the corresponding International Application No. PCT/KR2013/003326.

*Primary Examiner* — Roberts Culbert
(74) *Attorney, Agent, or Firm* — Stein IP, LLC

(57) ABSTRACT

The present invention provides a method for fabricating slanted copper nanorods. The method includes manufacturing a workpiece configured to include an etch stop layer on a wafer, placing the workpiece in a slanted position, and etching the slanted workpiece, forming a copper (Cu) layer on the slanted workpiece by plating, removing an over-plated portion from the copper layer, and removing a polysilicon (poly Si) excluding copper from the surface of the workpiece. According to the invention, copper nanorod structures having a uniform array can be fabricated in a large area at a high process yield compared to conventional methods. In addition, the angle and diameter of copper nanorods can be controlled as desired so that the applicability thereof can be greatly increased. Moreover, the present invention can be applied to processes for fabricating various devices, including semiconductor devices, MEMSs (microelectromechanical systems), optical devices, gas sensors, display devices, etc.

5 Claims, 12 Drawing Sheets

(51) Int. Cl.
*H01L 21/288* (2006.01)
*H01L 21/321* (2006.01)
*H01L 21/3213* (2006.01)

(56) References Cited

U.S. PATENT DOCUMENTS

2012/0168713 A1 7/2012 Lee et al. .......................... 257/9
2012/0301743 A1 11/2012 Walker et al. ................ 428/608

FOREIGN PATENT DOCUMENTS

| KR | 10-0357222 | B1 | 10/2002 |
|----|------------|----|---------|
| KR | 10-0364207 | B1 | 6/2003 |
| KR | 10-2007-0016897 | A | 2/2007 |
| KR | 10-2012-0096851 | A | 8/2012 |

METHOD FOR MANUFACTURING SLANTED COPPER NANORODS

CROSS-REFERENCE TO RELATED APPLICATIONS

This application is a national stage of International Application No. PCT/KR2013/003326, filed Apr. 19, 2013, which claims the benefit of priority to Korean Application No. 10-2013-0005075, filed Jan. 16, 2013, in the Korean Intellectual Property Office, the disclosures of which are incorporated herein by reference.

TECHNICAL FIELD

The present invention relates to a method for fabricating slanted copper nanorods, and more particularly, to a method for fabricating slanted copper nanorods, in which the slanted copper nanorods are formed to have a three-dimensional structure.

The present invention has been derived from research conducted as part of the Core Individual Research Project sponsored by the Korean Ministry of Education, Science and Technology and the National Research Foundation of Korea (Project Management No.: 1345191908; Project Title: Multi-directional Slanted Plasma Etching for Template-less Direct Patterning of Three-dimensional High-aspect Ratio Microstructures).

BACKGROUND ART

Slanted nanorod structures are widely used in a variety of fields, including the fields of not only semiconductor-based microelectromechanical systems (MEMS) but also photonic crystal devices, display devices, etc.

Copper having excellent electrical conductivity is used in a variety of structures depending on the purposes of the application thereof. In recent years, research into the fabrication of micro-devices using slanted copper nanorod structures has been actively carried out. Slanted copper nanorods can be used as gas sensors, and electrode materials for secondary batteries and supercapacitors.

A technology related to a typical method for fabricating such slanted copper nanorods is disclosed in Korean Patent No. 0281241, and a technology for patterning a workpiece by focusing ions, extracted from plasma, on the workpiece is disclosed in Korean Patent No. 0364207.

Hereinafter, a method of performing plasma etching after changing the grid plane of the top of a Faraday cage and a focused ion beam system and method, disclosed in Korean Patent Nos. 0281241 (hereinafter referred to as "prior art 1") and 0364207 (hereinafter referred to as "prior art 2"), will be described in brief.

FIG. 1 is a cross-sectional view illustrating an etching system that is implemented by bringing a Faraday cage having a grid plane slanted with respect to a substrate into electrical contact with the cathode of a TCP plasma etching reactor, according to prior art 1.

Referring to FIG. 1, an etching method using a Faraday cage 14 enables a substrate to be patterned in a relatively simple manner in a high-density plasma atmosphere, and thus is frequently used for the fabrication of slanted nanorods. In this case, the Faraday cage 14 refers to a closed box made of a conductor. When the Faraday cage 14 is placed in plasma, a sheath is formed on the outer surface of the cage so that an electric field in the cage is maintained constant. In this case, when the top of the cage is replaced with a fine grid, the sheath is formed along the surface of the grid. Accordingly, ions, which are accelerated in the sheath formed horizontally on the surface of the grid, are incident into the cage and then arrive at the substrate while maintaining the incident directionality thereof. Therefore, the ion incident angle can be adjusted as desired by varying the slope of a workpiece holder. The use of this Faraday cage 14 has an advantage in that a slanted etched structure can be fabricated in one step. However, the slanted etching method using the Faraday cage 14 according to prior art 1 has a disadvantage in that it may be applied only when a material that can be etched by plasma is used. For example, in the case in which a material to be etched is copper as shown in FIG. 2, plasma etching cannot be applied thereto. Due to this problem, there has been no method for fabricating slanted copper nanostructures using plasma, and no particular solution thereto has been found to date.

FIG. 3 is a cross-sectional view illustrating an example of a focused ion beam system according to prior art 2. Referring to FIG. 3, focused ion beam etching (FIBE) that is performed by the focused ion beam system of prior art 2 is a method that includes extracting ions, formed in plasma, by acceleration, and etching a specific portion of a substrate by focusing the extracted ions thereon. This method enables the independent control of parameters contributing to etching, including ion beam directions, ionic fluxes, energy and the like, and thus has been widely used for the fabrication of slanted nanorod structures. In addition, this method has an advantage in that since it etches the workpiece using the physical energy of ions, it can form nanorod structures regardless of the type of workpiece.

However, to perform ion beam etching according to prior art 2, a complex ion source and a system for focusing extracted ions on a workpiece are required, and thus the etching process is highly expensive. Furthermore, since the portion to be etched corresponds to only the diameter of an ion beam, only a very restricted portion is etched. Moreover, the etching speed of ion beam etching is very low because physical sputtering acts as a major mechanism. To overcome the problem of the low etching speed of ion beam etching, techniques have been introduced, including reactive ion beam etching (RIBE) in which reactive gas is incorporated into an ion source, or chemically assisted ion beam etching (CAIBE) in which reactive gas is additionally injected immediately before an ion beam reaches a substrate. However, since the content of reactive radicals that participate in etching in RIBE or CAIBE is much lower than that in general plasma etching, the etching speed of RIBE or CAIBE is as low as $1/10$ or less of the etching speed of general plasma etching, and thus the process yield of RIBE or CAIBE is very low. Therefore, RIBE or CAIBE suffers from difficulty fabricating a large-area workpiece.

As a result, in the prior arts, a technology for controlling the angle and aspect ratio of slanted patterns is essential to form slanted copper nanorod structures. However, a technology capable of fabricating slanted nanorod structures in large amounts has not yet been developed. Accordingly, ion beam etching techniques that pattern a workpiece simply using the physical energy of particles have been chiefly used. As described above, the ion beam etching techniques have shortcomings, including ion implantation attributable to the high bombardment energy of ions, the lattice defect of a workpiece, the distortion of an etched shape attributable to the re-deposition of sputtered particles, etc. In addition, these techniques cannot fabricate a large-area workpiece, and thus are not suitable for commercialization.

SUMMARY OF THE DISCLOSURE

Accordingly, the present invention has been made to solve the above problems occurring in the prior art and overcome the limitations of the conventional methods for fabricating copper nanorods using focused ion beam etching (FIBE), and an object of the present invention is to provide a method for fabricating slanted copper nanorods, which can form a uniform array of copper nanorods by etching a large-area workpiece in a slanted manner using high-density plasma, forming a copper layer in the gaps of the etched workpiece, and removing Si from the surface of the workpiece.

To achieve the above object, in accordance with an aspect of the present invention, there is provided a method for fabricating slanted copper nanorods, including: manufacturing a workpiece configured to include an etch stop layer on a wafer; placing the workpiece in a slanted position, and etching the slanted workpiece; forming a copper (Cu) layer on the slanted workpiece by plating; removing an over-plated portion from the copper layer; and removing a polysilicon (poly Si) excluding copper from the surface of the workpiece.

In the present invention, etching the slanted workpiece may include providing a slanted angle to the workpiece using a Faraday cage.

In the present invention, the angle at which the workpiece is placed in the slanted position may range from 0° to 60°.

In the present invention, forming the copper layer may be performed by electroless plating.

In the present invention, removing the over-plated portion from the copper layer may be performed by chemical mechanical polishing.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

The terms or words used in the present specification or the claims should be interpreted as having meanings and concepts suitable for the technical scope of the present invention based on the principle that an inventor can appropriately define the concepts of terms in order to describe his or her invention in the best way.

It should be understood that throughout the specification, when any part is described as including any component, it does not exclude another component but may further include another component, unless otherwise specified. In addition, the term " . . . unit" as used herein refers to a unit that performs at least one function or operation, and may be implemented as hardware, software, or a combination of hardware and software.

Hereinafter, a method for fabricating slanted copper nanorods according to embodiments of the present invention will be described in detail with reference to the accompanying drawings.

Figure 1:
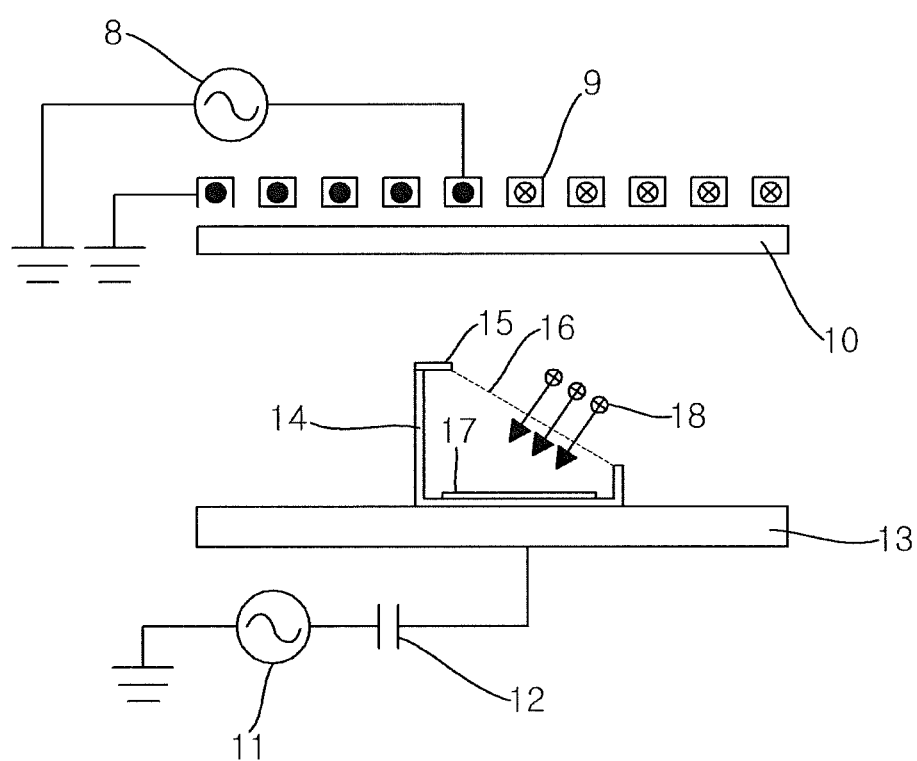
FIG. 1 is a cross-sectional view illustrating an etching system that is implemented by bringing a Faraday cage having a grid plane slanted with respect to a substrate into electrical contact with the cathode of a TCP plasma etching reactor, according to prior art 1.
Figure 2:
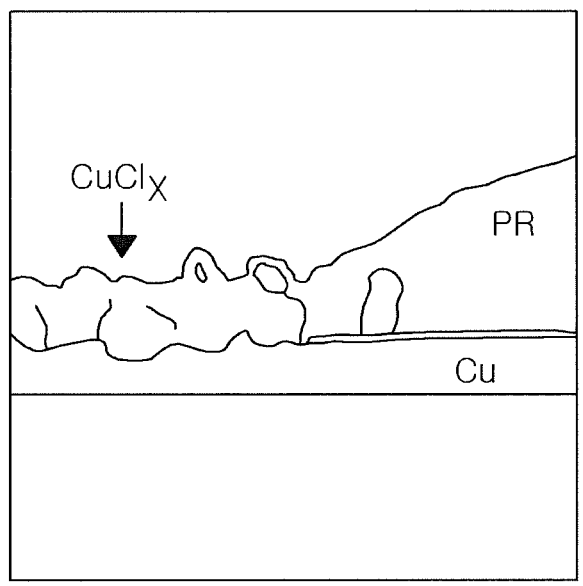
FIG. 2 is a photograph showing the state of Cu etched using $Cl_2$ plasma according to prior art 1.
Figure 3:
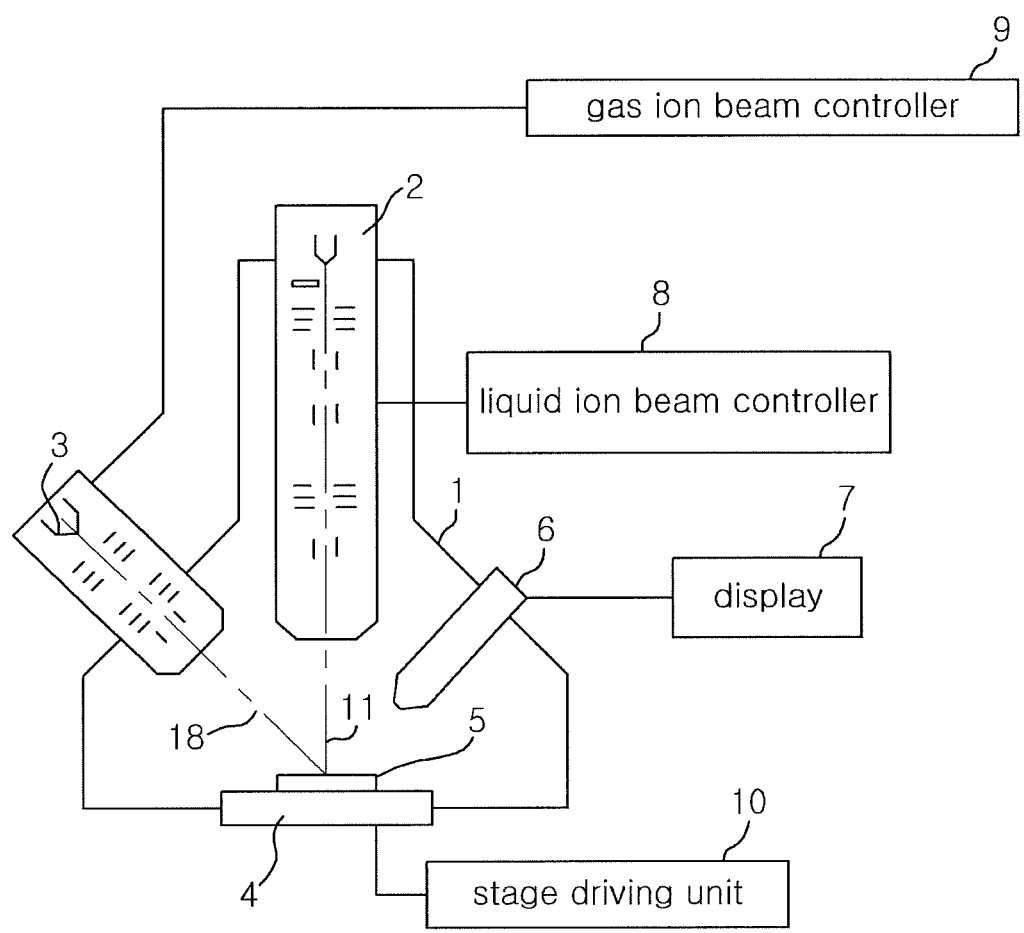
FIG. 3 is a cross-sectional view showing an example of a focused ion beam system according to prior art 2.
Figure 4:
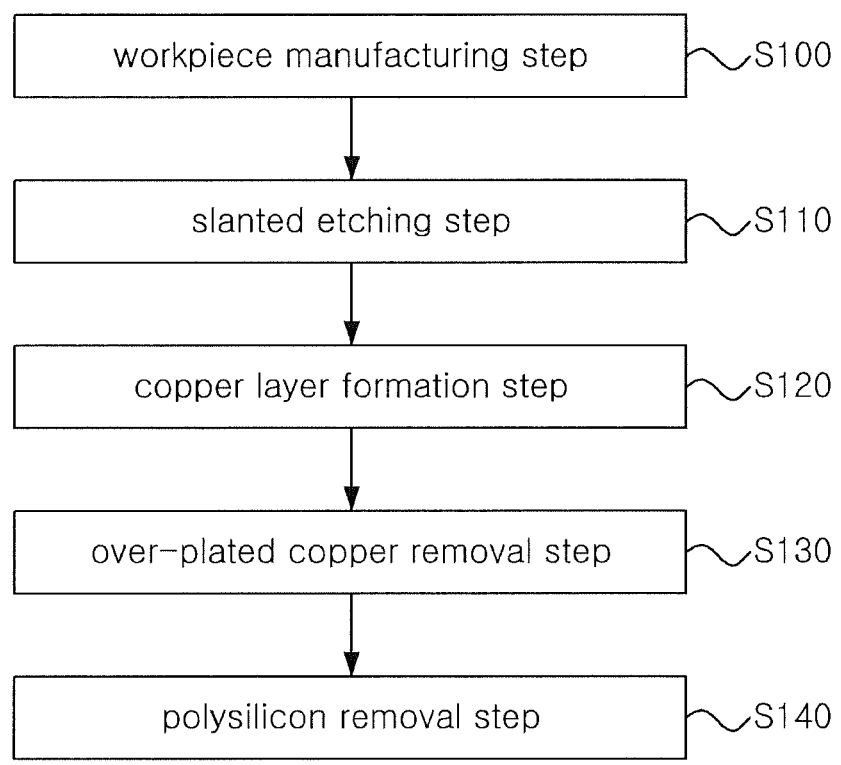
FIG. 4 is a block diagram showing a method for fabricating slanted copper nanorods according to the present invention.
Figure 12:
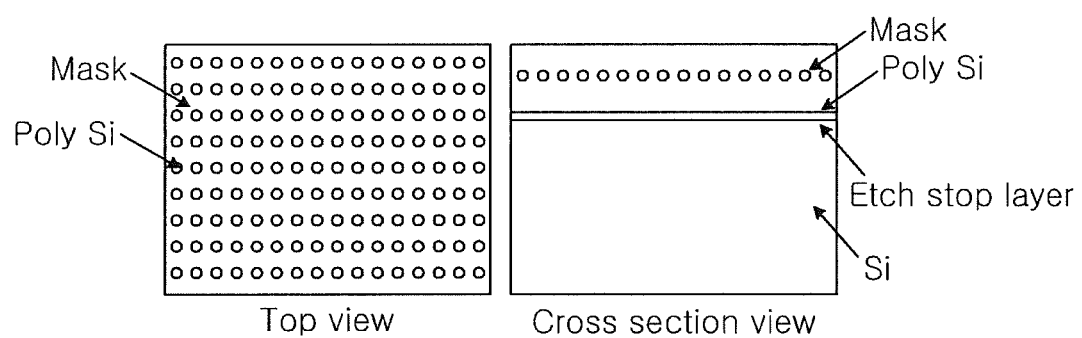
FIG. 12 is a photograph showing a master workpiece that is used in a method for fabricating slanted copper nanorods according to the present invention.
Figure 13:
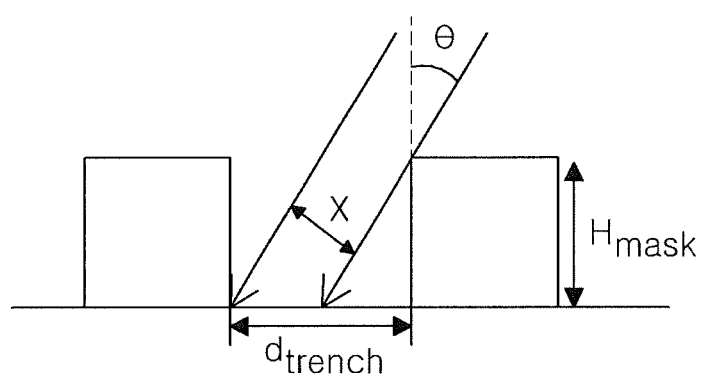
FIG. 13 is a reference view showing the state in which the angle and diameter of copper nanorods are controlled as desired in a method for fabricating slanted copper nanorods according to the present invention.

FIG. 4 is a block diagram showing a method for fabricating slanted copper nanorods according to the present invention; FIGS. 5 to 11 are views sequentially showing the steps of a process for fabricating slanted copper nanorods according to the present invention; FIG. 12 is a photograph showing a master workpiece that is used in a method for fabricating slanted copper nanorods according to the present invention; and FIG. 13 is a reference view showing the state in which the angle and diameter of copper nanorods are controlled as desired in a method for fabricating slanted copper nanorods according to the present invention.

As shown in these drawings, a method for fabricating slanted copper nanorods according to an embodiment of the present invention includes a workpiece manufacturing step S100, a slanted etching step S110, a copper layer formation step S120, an over-etched copper removal step S130, and a polysilicon removal step S140.

Figure 5:
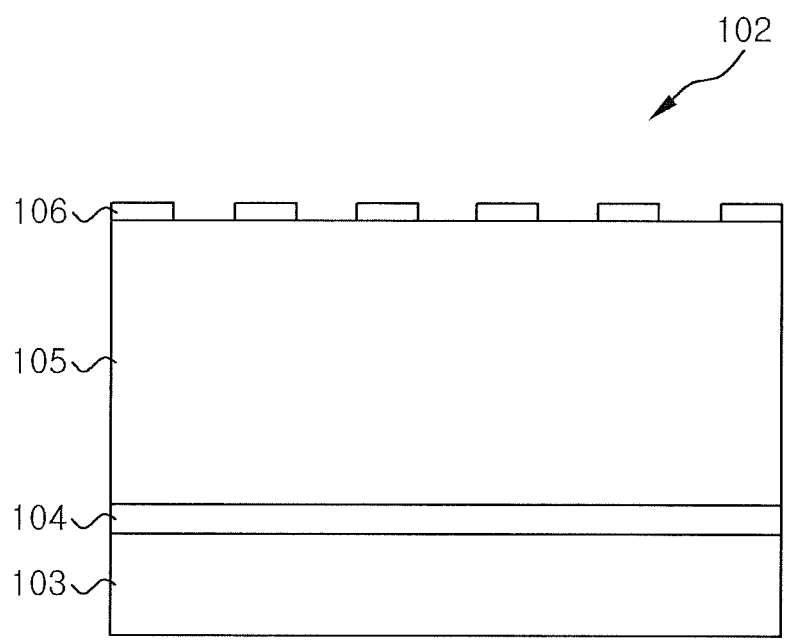
FIGS. 5 to 11 are views sequentially showing the steps of a process for fabricating slanted copper nanorods according to the present invention.

The workpiece manufacturing step S100 is the step of manufacturing a workpiece 102 by sequentially stacking a silicon wafer 103, an $SiO_2$ etch stop layer 104, a polysilicon (poly Si) 105 and a mask 106 in this order (see FIG. 5).

That is, the workpiece manufacturing step S100 is the step of preparing a workpiece 102 by forming the $SiO_2$ etch stop layer 104 on the silicon wafer 103 by, for example, a thermal oxidation process, growing the polysilicon 105 thereon by chemical vapor deposition, and then patterning the $SiO_2$ mask 106.

The material of the wafer 103, such as silicon, may be selected from among various thin films, including insulators, semiconductors, metals, etc., depending on the characteristics of the device and the purpose of the formation of copper nanostructures.

The $SiO_2$ etch stop layer may be replaced with a material, such as an $Si_3N_4$ (silicon nitride), SiC (silicon carbide), or amorphous carbon layer (ACL), which has a high etch selectivity with respect to polysilicon.

The polysilicon 105 may be formed to various thicknesses depending on the length of copper nanostructures to be fabricated.

The $SiO_2$ mask 106 may be replaced with a material having a high etch selectivity with respect to the polysilicon 105. Furthermore, the spacing of the mask 106 may range from several tens of nm to several μm depending on the purpose of the formation of copper nanostructures.

Figure 6:
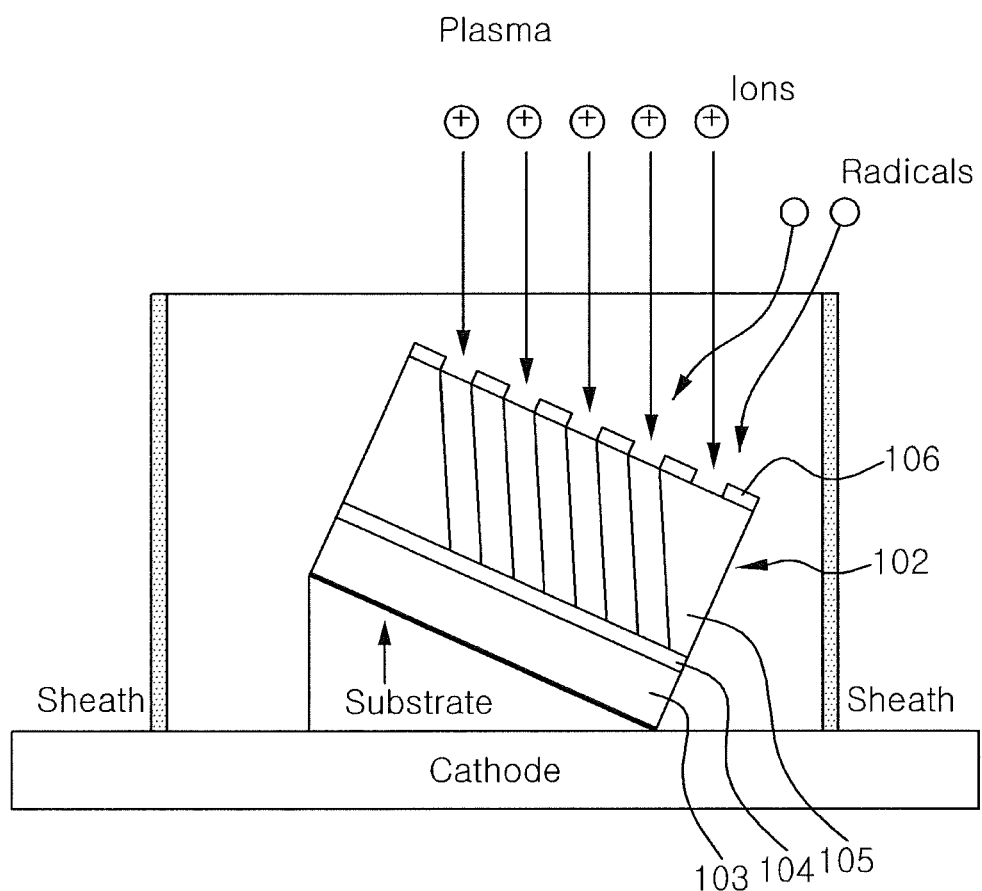
Figure 7:
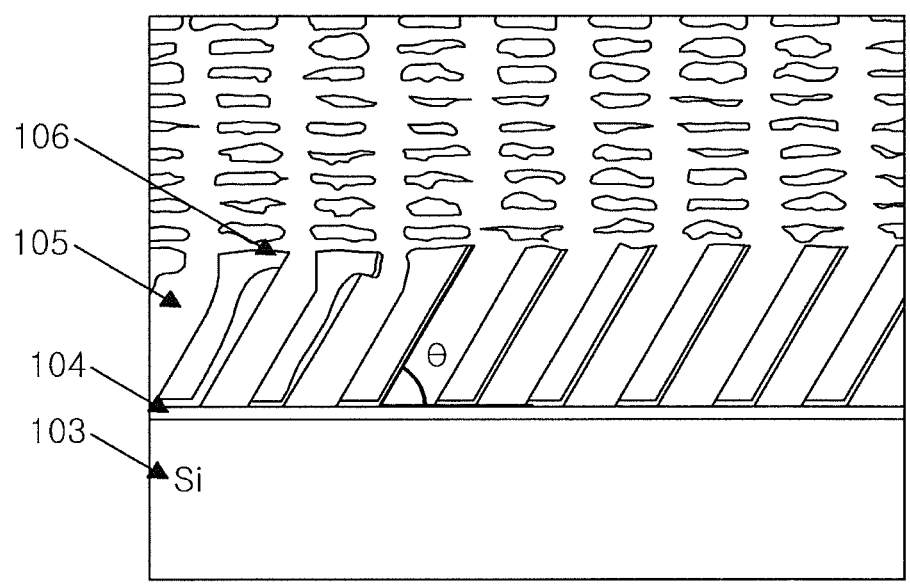

The slanted etching step S110 is the step of placing the workpiece 102 in a slanted position using a Faraday cage and etching the slanted workpiece with plasma (see FIGS. 6 and 7).

In the slanted etching step S110, an angle (θ) is provided to the workpiece 102 via the workpiece holder of the Faraday cage, and the slanted angle of the workpiece holder may be variously controlled within the range of 0-60°. In this embodiment, the angle (θ) of the workpiece 102 is 60° by way of example.

Meanwhile, a process gas that is used in the slanted etching step S110 may be a gas, such as $SF_6$ gas, $C_xF_y$ gas, $C_xH_yF_z$ gas or $SiF_4/O_2$ gas, which can control the etch selectivity of silicon with respect to the mask.

Furthermore, plasma etching in the slanted etching step S110 may be performed by a gas chopping process that can form an anisotropic etched shape. In the manufacture of a microelectromechanical system (MEMS), a gas-chopping process or a Bosch process known as time-multiplexed deep etching is widely used as a method for forming high-aspect-ratio Si. The Bosch process is the cyclic process of alternately performing etching and deposition, in which the etching step is performed using $SF_6$ plasma and the deposition step is performed using $C_4F_8$ plasma.

As shown in FIG. 6, the surface of the Faraday cage is not completely closed. The Faraday cage is a rectangular parallelepiped conductive box, the top of which is composed of a conductive porous grid plane. The cage includes a substrate holder, one surface of which is slanted, so that the substrate can be placed at a slanted angle with respected to the grid plane.

In this case, a sheath is formed on the grid plane of the Faraday cage disposed in plasma. The sheath is continuously formed not only on the conductive material of the grid but also on the open portions of the grid. Ions accelerated in the sheath in a direction perpendicular to the grid plane are incident into the cage through the open portions of the grid. In the cage, an electric field is uniform according to the principle of the Faraday cage, and thus the ions move in a direction identical to that during their passage through the grid plane and then bombard the slanted substrate. In the cage, the surface of the substrate is fixed in a position slanted with respect to the grid plane, and the ions are incident in a direction slanted with respect to the grid plane. Accordingly, etching is performed in a direction slanted with respect to the surface of the substrate. Therefore, slanted etching can be performed while the high etching rate of reactive ion etching and high-density plasma etching is being maintained. Particularly, the incident angles of the ions can be controlled as desired by changing the slope of the workpiece holder.

The copper layer formation step S120 is the step of plating the slanted workpiece 102 with a copper (Cu) layer. In this step, electroless plating is used to form the copper layer on the surface of the workpiece 102, and the surface of the workpiece is pretreated with a first solution for a first period, after which the workpiece is plated in a second solution containing a first additive for a second period (see FIG. 8).

In this case, the first solution is a solution containing 0.05-0.15 g/L (preferably 0.1 g/L) of $PdCl_2$ (palladium chloride), 4-6 ml/L (preferably 5 ml/L) of 45-55% (preferably 50%) HF (hydrogen fluoride), and 2-4 ml/L (preferably 3 ml/L) of 30-40% (preferably 35%) HCl (hydrochloric acid). The second solution is an aqueous solution (pH: 12.50 adjusted with sodium hydroxide (NaOH) as a pH adjusting agent; temperature: 85 to 90° C.) containing 4-6 ml/L (preferably 5 ml/L) of a surfactant (Triton-X100 (2,2'-dipyridyl)), 4-6 g/L (preferably 5 g/L) of $CuSO_4.5H_2O$ (copper sulfate), 14-16 g/L (preferably 15 g/L) of EDTA (ethylenediaminetetraacetic acid), 4-6 ml/L (preferably 5 ml/L) of HCHO (formaldehyde), and 0.02-0.06 g/L (preferably 0.04 g/L) of 2,2'-bipyridyl). Meanwhile, the first period is 35-45 seconds (preferably 40 seconds), and the second period is 4-10 minutes (preferably 7 minutes).

The over-plated copper removal step S130 is the step of removing copper, over-plated on the surface of the workpiece 102, by chemical mechanical polishing (CMP). In this step, the surface is polished so that over-plated copper and the mask can be completely removed (see FIG. 9).

Figure 8:
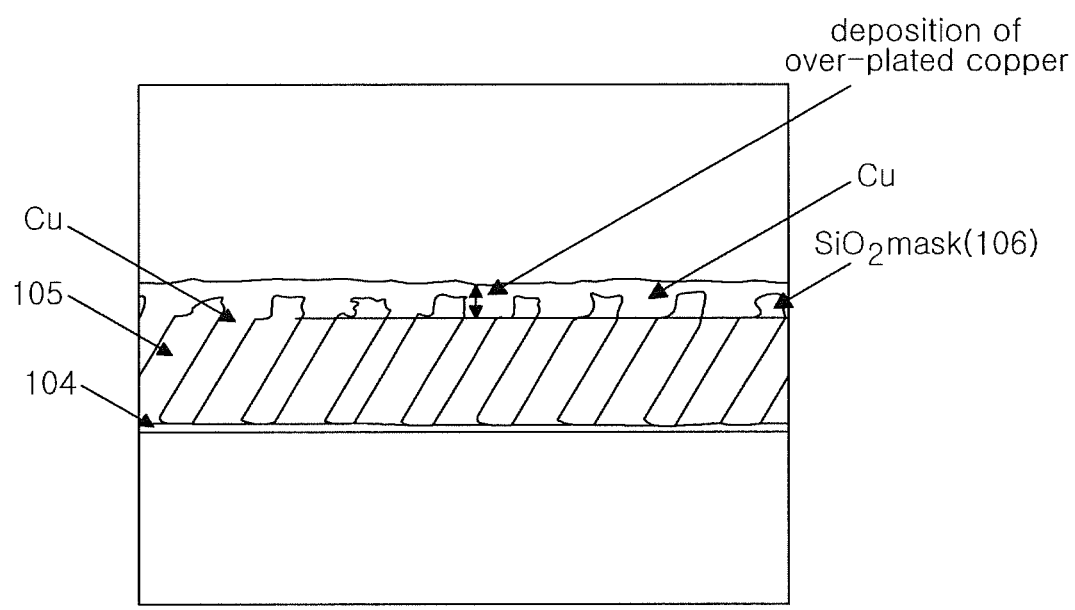
Figure 9:
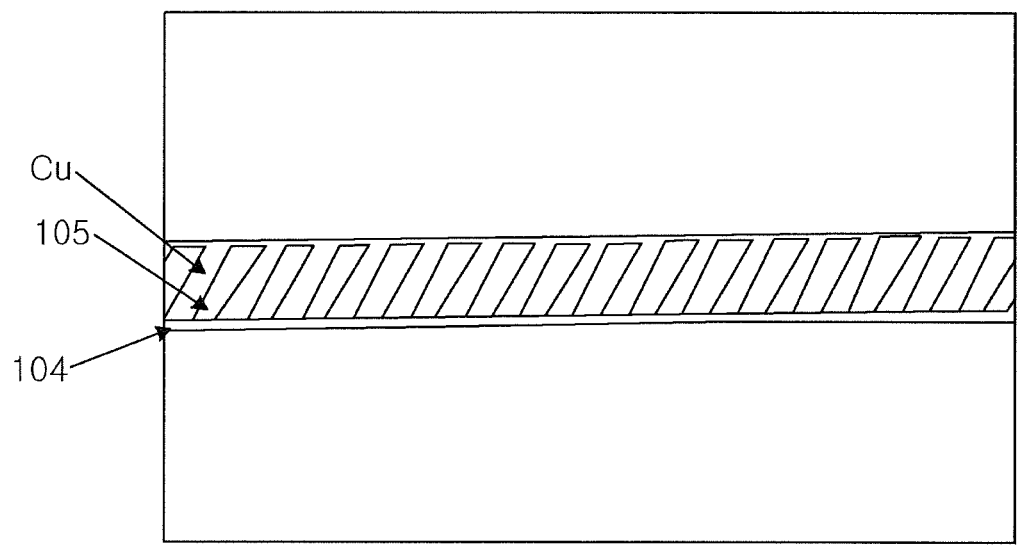

That is, in the over-plated copper removal step S130, as shown in FIG. 8, although copper should be filled only in the spaces of the polysilicon 105 during formation of the copper layer, the copper layer is also formed over the pattern in practice. For this reason, the copper layer formed over the pattern is removed. In this case, the copper layer formed over the pattern, excluding the space of the polysilicon 105, is referred to as "over-plated copper".

Figure 10:
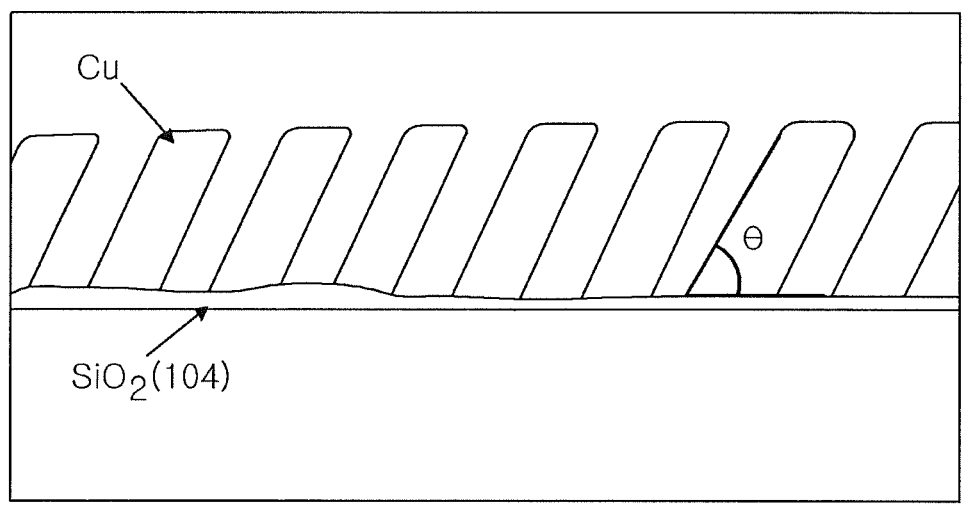
Figure 11:
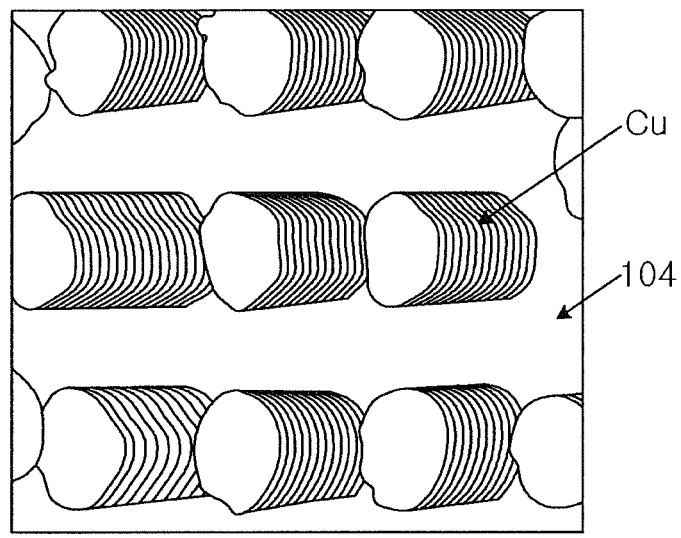

The polysilicon removal step S140 is the step of removing polysilicon (poly Si), excluding copper, from the surface of the workpiece 102, thereby forming slanted copper nanorods (see FIGS. 10 and 11).

That is, in the polysilicon removal step S140, a first solution, a second solution and a third solution are heated to a first temperature to wet-etch the mask 106 and the workpiece from which the copper layer on the surface was completely removed. To remove the polysilicon, not only wet etching but also plasma etching may be used.

In this case, the first solution contains 200-300 ml (preferably 250 ml) of KOH (potassium hydroxide); the second solution contains 150-250 ml (preferably 200 ml) of normal propanol; and the third solution contains 750-850 ml (preferably 800 ml) of $H_2O$ (water). Particularly, the first, second and third solutions are heated to a temperature ranging from 30 to 120° C. (preferably 80° C.).

As a result, according to the present invention, the slanted etching method that can easily control the angle and diameter of copper nanorods by use of the Faraday cage is used to form slanted copper nanorods. Based on this, slanted copper nanorods having a uniform array can be fabricated in a large area. When the method according to the present invention is used, copper nanorods having a uniform slope and diameter as shown in FIGS. 10 and 11 can be formed.

In this case, the slanted copper nanorods can be easily formed in a large area using the Faraday cage system in which a plurality of workpieces 102 as shown in FIG. 6 are arranged at predetermined intervals in the Faraday cage. This is, a workpiece arrangement step (not shown) may further be performed between the workpiece manufacturing step S100 and the slanted etching step S110, and thus the plurality of workpieces 102 are arranged per desired area, thereby making it possible to form copper nanorods in a large area.

In addition, since the slanted copper nanorods are formed by etching the slanted workpiece having a uniform pattern by use of the Faraday cage, copper nanorods having a uniform array can be formed. That is, the array of the copper nanorods is determined by the slanted etched structures. When the array of a master workpiece is uniform as shown in FIG. 12, copper nanorod structures formed using the master workpiece are also uniform.

In addition, the angle and diameter of the slanted copper nanorods can be controlled as desired. Since the angle of the etched structures changes depending on the angle of the workpiece holder, the angle of the copper nanorods can be controlled by controlling the angle of the workpiece holder. Moreover, the diameter of the copper nanorods can be controlled by controlling the pattern spacing of the mask 106.

Meanwhile, the diameter (X) of the copper nanorods is calculated using the following equation 1 when the pattern spacing of mask is $d_{trench}$ and the ion incident angle is θ, as shown in FIG. 13. Accordingly, the diameter (X) of the copper nanorods can be easily controlled by controlling the pattern spacing of the mask and the ion incident angle.

$$X = \cos\theta(d_{trench} - H_{mask} \cdot \tan\theta) \quad (1)$$

According to the present invention, copper nanorod structures having a uniform array can be fabricated in a large area at a high process yield compared to the conventional methods. Furthermore, according to the present invention, the angle and diameter of copper nanorods can be controlled as desired so that the applicability thereof can be greatly increased.

Moreover, the present invention can be applied to processes for fabricating various devices, including semiconductor devices, MEMSs (microelectromechanical systems), optical devices, gas sensors, display devices, etc.

While the present invention has been described in conjunction with the limited embodiments and drawings, these are provided merely to help an overall understanding of the present invention. The present invention is not limited to these embodiments, and various modifications and variations can be made based on the foregoing description by those having ordinary knowledge in the art to which the present invention pertains.

Accordingly, the scope of the present invention should not be determined based on only the described embodiments, but should be determined based on the following claims and equivalents to the claims.

What is claimed is:

1. A method for fabricating slanted copper nanorods, the method comprising:
   manufacturing a workpiece configured to include an etch stop layer on a wafer;
   placing the workpiece in a slanted position, and etching the slanted workpiece;
   forming a copper (Cu) layer on the slanted workpiece by plating;
   removing an over-plated portion from the copper layer; and
   removing a polysilicon (poly Si) excluding copper from the surface of the workpiece.

2. The method of claim 1, wherein etching the slanted workpiece comprises providing a slanted angle to the workpiece using a Faraday cage.

3. The method of claim 1, wherein an angle at which the workpiece is placed in the slanted position ranges from 0° to 60°.

4. The method of claim 1, wherein forming the copper layer is performed by electroless plating.

5. The method of claim 1, wherein removing the over-plated portion from the copper layer is performed by chemical mechanical polishing.

* * * * *